United States Patent [19]

Otsuka et al.

[11] Patent Number: 4,541,003
[45] Date of Patent: Sep. 10, 1985

[54] SEMICONDUCTOR DEVICE INCLUDING AN ALPHA-PARTICLE SHIELD

[75] Inventors: Kanji Otsuka, Higashiyamato; Kazumichi Mitsusada, Kodaira; Masao Sekibata, Kunitachi; Shinji Ohnishi, Kokubunji, all of Japan

[73] Assignee: Hitachi, Ltd., Tokyo, Japan

[21] Appl. No.: 388,216

[22] Filed: Jun. 14, 1982

Related U.S. Application Data

[63] Continuation of Ser. No. 94,914, Nov. 16, 1979, abandoned.

[30] Foreign Application Priority Data

Dec. 27, 1978 [JP] Japan .................... 53-159831

[51] Int. Cl.³ .............. G11C 11/40; H01L 27/04; H01L 23/08
[52] U.S. Cl. .................... 357/74; 357/29; 357/23.6; 357/84
[58] Field of Search ............ 357/29, 84, 74, 80, 357/23 C

[56] References Cited

U.S. PATENT DOCUMENTS

| | | | |
|---|---|---|---|
| 3,492,547 | 1/1970 | Recko et al. | 357/74 |
| 3,582,656 | 6/1971 | Koehler | 357/29 |
| 3,697,666 | 10/1972 | Wakley et al. | 357/74 |
| 3,748,543 | 7/1973 | Roberson | 357/74 |
| 3,828,425 | 8/1974 | Manus | 29/590 |

OTHER PUBLICATIONS

*Electronics,* Jun. 8, 1978, pp. 42–43, "Dynamic Memories Racked by Radiation".
IEEE Transactions on Nuclear Science, vol. NS 25, No. 6, Dec. 1978, (Proceedings of Annual Conf. on Nuclear & Space Radiation, Jul. 1978) pp. 1166–1171.
*NTZ Archiv,* 1979, No. 5, pp. 113–119.
*Electronics,* Mar. 15, 1979, p. 85.

*Primary Examiner*—William D. Larkins
*Attorney, Agent, or Firm*—Antonelli, Terry & Wands

[57] ABSTRACT

The present invention relates to a semiconductor device having a semiconductor element which is sealed by a ceramic package, wherein a shielding member is provided near it from upper surface of the semiconductor element to shield the alpha-particles radiated from the package.

24 Claims, 23 Drawing Figures

SEMICONDUCTOR DEVICE INCLUDING AN ALPHA-PARTICLE SHIELD

This is a continuation of of application Ser. No. 94,914 filed Nov. 16, 1979, now abandoned.

BACKGROUND OF THE INVENTION

The present invention relates to a semiconductor device, and more specifically to a semiconductor device having sealed therein a semiconductor element which constitutes a memory circuit.

In general, the semiconductor elements are sealed by a sealing member such as a ceramic material, a glass or a plastic material (resin). Among these sealing members (hereinafter referring to as packages), the ceramic package made of a ceramic material contains uranium and thorium in amounts of several ppm. As mentioned, for example, in 16th Annual Proceedings of 1978 International Reliability Physics Symposium, Apr. 18–20, 1978, San Diego, U.S.A., however, these impurities emit alpha-particles causing the memory circuit to erroneously operate. Due to this fact, the reliability of the semiconductor elements is often greatly decreased.

The inventors of the present invention have analyzed the erroneous operation of the memory circuit caused by the alpha-particles as mentioned below.

Uranium and thorium release energy over a range of 4 to 9 MeV when they decay naturally. The energy distribution of alpha-particles emitted from the package, however, ranges from 0 to 9 MeV, since the alpha-particles generated in the package come into collision with the molecules before they reach the surface of the material.

The alpha-particles which have infiltrated into a silicon pellet excite the electrons and travel while gradually losing their energy. Therefore, the range of alpha-particles in the substance is in reverse proportion to the density of the substance and is proportional to the initial energy. In silicon, the alpha-particles excite the electrons to impart energy of 3.6 eV. Further, a typical 5 MeV alpha has a range of 25 μm in silicon. The electrons excited in silicon give rise to the generation of holes, whereby pairs of electrons and holes are generated along the loci of alpha-particles. Here, if it is supposed that the energy of the alpha-particles is 5 MeV, the number of the excited electrons Ne is given by, $$Ne \simeq 5\ \text{MeV}/3.6\ \text{eV} = 1.4 \times 10^6$$

This is equivalent to an electric amount of 0.22 picocoulombs. The electrons then diffuse along with the concentration gradient, and recombine to extinguish. However, when the electric charge is supplemented by the biasing and is not negligible as compared with the electric amount under a boundary condition in a pellet, the device operates erroneously. The erroneous operation takes place without deteriorating the physical properties of the element, and is hence often called soft error.

In order to prevent such erroneous operation, the package material should be purified to such a high concentration that it does not contain uranium or thorium. Usually, however, the package material is made of a composite material consisting of several raw materials, and may contain impurities introduced through manufacturing steps. Therefore, it is difficult to make the whole package using a material which does not contain uranium or thorium. Or even if such a material is obtained, the package will not be suited for practical application because of expensive manufacturing cost.

SUMMARY OF THE INVENTION

The object of the present invention therefore is to provide a semiconductor device which is designed to prevent the erroneous operation of the semiconductor element that will be caused by the alpha-particles.

According to the present invention, the feature resides in that a material containing minimal uranium or thorium (hereinafter referred to as highly purified material for the purpose of convenience) or a shielding member for shielding the alpha-particles emitted by the sealing member, is disposed near the upper surface of the semiconductor element.

The upper surface of the semiconductor element referred to here represents a main surface close to the active region where carriers (electrons or holes, or electrons and holes) generated in the semiconductor element by an external voltage are actively excited, so that the element works as an active element (transistor, diode) or as a passive element (capacitor or the like).

To facilitate an understanding of the present invention, various concrete embodiments are mentioned below, in which the same members are represented by the same reference numerals.

DESCRIPTION OF THE PREFERRED EMBODIMENTS

EXAMPLE 1

Figure 1:
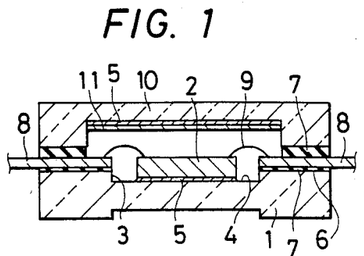
FIGS. 1 to 17 are cross-sectional views illustrating semiconductor devices according to a variety of embodiments of the present invention.

FIG. 1 illustrates a semiconductor device in which a support substrate and a cap forming a package of a semiconductor element (simply referred to hereinafter as a pellet) are made of a high alumina ceramic ($Al_2O_3$ content of 90% by weight or more).

The support substrate 1 has a recess 3 formed in the center, and the pellet 2 is fastened via a gold layer (Au layer) 5 onto a bottom portion 4 in the recess 3. Onto the surfaces of projections 6 of the support substrate 1 are adhered externally stretching leads 8 made of a Ni(42%)-Fe(58%) alloy or a Ni(29%)-Co(17%)-Fe(54%) alloy via a low-melting glass ($PbO$-$B_2O_3$ type) which sufficiently melts at a temperature of 400° to 500° C. Aluminum is coated on the upper surfaces in the inner tips of the externally stretching leads 8 by means of metal vaporization or cladding method. An aluminum wire 9 is bonded to the bonding pads (not shown) of the pellet 2 and to the inner tips of the externally stretching leads 8, such that the externally stretching leads 8 are electrically connected to the bonding pads of the pellet 2.

On the other hand, a cap 10 has a highly purified substrate 11 stuck onto a recessed bottom surface thereof by a suitable adhesive agent 5. The highly purified substrate is made of a single-crystal silicon Si having a thickness of 50 to 150 $\mu$m purified to a degree of 99.999% (five-nine) to 99.99999999 (ten-nine). The substrate material should be purified to a degree comparable to that of the silicon pellet which incorporates the transistor or the like. The thickness of the highly purified substrate 11 may be slightly changed depending upon the density of the alpha-particles emitted from the cap 10, but should be greater than 50 $\mu$m. A gold layer 5 is used to adhere the highly purified substrate 11 onto the cap 10. Namely, the silicon substrate 11 is adhered onto the recessed bottom surface of the cap 10 owing to the eutectic bonding of silicon and gold. An SiO$_2$ film (not shown) is coated on the surface of the silicon substrate 11 facing the pellet 2 such that short-circuit will not develop even when a plurality of aluminum wires 9 contact the surface. The low-melting glass 7 is adhered on the surfaces of the projections of the cap 10. The cap 10 and the support substrate 1 are adhered together by the low-melting glass 7 to completely seal the pellet 2.

The highly purified substrate 11 may be made of any material if it can be purified to a state which does not contain alpha sources. Metals and insulating materials will give good results.

For example, a highly purified aluminum plate of which the surface is anodically oxidized to a thickness of about 5 $\mu$m may be thermally stuck onto the recessed bottom surface of the cap 10 using glass as an adhesive agent. Here, the anodic oxidation is not necessary provided the height of the aluminum wires 9 have a margin with respect to the height of the highly purified substrate 11. The aluminum plate should have a purity of about 99.999% (five-nine) and a thickness of 0.05 mm to 0.5 mm. In addition to the aluminum substrate, an oxygen free copper substrate may be employed.

According to the aforementioned Example 1 in which the highly purified substrate is provided only on the recessed bottom surface of the cap faced to the upper surface of the pellet, the alpha-particles emitted from the cap 10 are shielded by the highly purified substrate. Besides, since the alpha-particles are scarecely radiated by the highly purified substrate, the soft error can be sufficiently prevented. The reasons are technically analyzed by the inventors of the present invention as mentioned below.

In a pellet forming a plurality of MIS transistors on the surface portion thereof, the alpha-particles generated in a portion lower than the pellet surfaces (upper surface) do not affect the active regions such as channel regions or information storage regions formed on the surface of the MIS transistors, and can be neglected. It is because, the range of the alpha-particles infiltrated into the pellet is about 25 to 50 $\mu$m. Therefore, even if the alpha-particles generated from the support substrate have infiltrated into the interior of the pellet from the back surface (lower surface) thereof, the alpha-particles do not reach the channel regions or the information storage regions formed on the surface of the pellet which usually has a thickness of 150 $\mu$m to 500 $\mu$m.

Therefore, the problems related to the alpha-particles sources rather resides in the materials on the upper side of the pellet surface.

The materials located above the pellet surface include end surfaces of externally stretching leads, end surfaces of cap glass, side surfaces in the recessed portion of the cap, and bottom surface in the recessed portion of the cap. Among them, the bottom surface in the recessed portion of the cap has the greatest area with respect to the surface of the pellet. Therefore, the alpha-particles incident from the bottom surface in the recesssed portion of the cap account for a major cause of soft error. Namely, among the alpha-particles generated from the four surfaces in the package, what present a problem are those directed to the surface of the pellet. Accordingly, solid angles of these surfaces with respect to the surface of the pellet present a problem. The ratios of the planes obtained by integrating the solid angles by 360° represent the affecting degrees of the alpha-particles to the pellet. Besides, it is calculated that the recessed bottom surface of the cap occupies the area at a ratio of 0.95 to 0.995 with respect to the side surfaces of the recessed portion of the cap. This is a known value determined by the sizes. Besides, the bottom surfaces of the cap occupies the area at a ratio of 0.90 to 0.99 with respect to the cap glass (low-melting glass).

On the other hand, the emitting amount of the alpha-particles differs depending upon the materials. Table 1 shows examples of the values.

TABLE 1

| Source of radiation | Major material | Product | Number of alpha-particles radiated (number/cm$^2$ · hr.) |
|---|---|---|---|
| Support substrate and cap | High alumina ceramics (Al$_2$O$_3$ content is 90% by weight or greater) | A | 0.51 |
| | | B | 0.20 |
| Low-softening glass | PbO—B$_2$O$_3$ type (PbO content is greater than 60% by weight) | C | 4.00 |
| | | D | 20.0 |
| | | E | 3.2 |
| | | F | 2.0 |
| Externally stretching lead | Ni(29%)—Co(17%)—Fe (54%) alloy | G | 0.20 |
| | Ni(42%)—Fe(58%) alloy | H | 0.20 |
| Sealing member and sealing portion | Epoxy resin (Acid anhydride cure) | I | 0.20 |
| | Ceramics surface of a laminated ceramics package (Al$_2$O$_3$ content is greater than 90% by weight) | J | 1.20 |
| | | K | 0.05 |
| | Ceramics surface and tungsten metallized surface of a laminated ceramics package (Al$_2$O$_3$ content is greater than 90% by weight, and W content is greater than 90% by weight) | L | 2.00 |

As will be obvious from Table 1 above, the radiating amount of the alpha-particles greatly differs depending upon the products. With regard to a semiconductor device consisting of a cap made of a product B which radiates the alpha-particles in minimum amounts (0.20/cm$^2$·hr) and a cap glass made of a product F (2.0/cm$^2$·hr), the total amount of alpha-particles which affect the pellet surface when the affecting degrees based upon the areas are taken into consideration, is given by 0.20×(0.90 to 0.99)+2.0×(0.1 to 0.01)=0.38 to 0.218/cm$^2$·hr.

Here, the end surfaces of the externally stretching leads which affect the pellet surfaces have very small areas and radiate the alpha-particles in an amount as small as 0.20/cm²·hr as shown in Table 1, and are disregarded. If the externally stretching leads are present at positions lower than the upper surface of the pellet, the alpha-particles radiated from the end surfaces of the leads can be completely neglected.

If the highly purified substrate containing almost no alpha-source is provided in the recessed portion of the cap, the total amount of alpha-particle radiation is given by the second term on the left side only, i.e., 0.2 to 0.02/cm²·hr. Therefore, the sources of alpha-particles are reduced to one-half to one-tenth that of the case where the highly purified material is not provided in the recessed portion of the cap.

EXAMPLE 2

Figure 2:
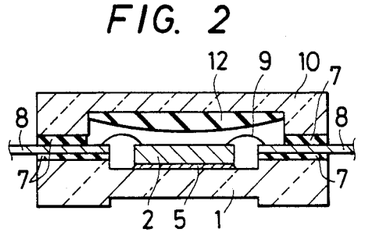

FIG. 2 shows a semiconductor device having the support substrate and the cap which are made of a high alumina ceramics in the same way as in Example 1. In FIG. 2, a highly purified material 12 which gelatinizes or solidifies from the liquid state upon aftertreatment such as curing is adhered onto the recessed bottom surface of the cap 10 instead of using a highly purified material shaped into the form of a substrate. Concrete examples of the highly purified material 12 include silicone rubber, polyimide resin, polyimide isoindole quinazoline dione resin, and the like.

When such a highly purified material is used, the effects similar to those of Example 1 can be obtained, and the manufacturing procedure can be very simplified.

EXAMPLE 3

The method which provides the highly purified substrate 11 or the highly purified material 12 on the bottom surface in the recessed portion only of the cap 10, can reduce the effects of the alpha-particles onto the pellet surface into one-half to one-tenth. To further reduce the effects, a semiconductor device of a construction shown in FIG. 3 can be presented.

Figure 3:
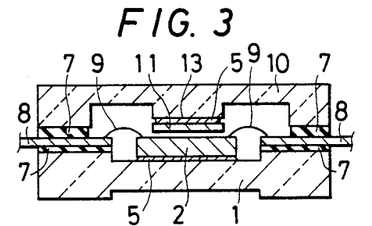

According to the construction of FIG. 3, the highly purified substrate is brought close to the effective surfaces or active regions of the pellet 10, so that an incident solid angle that permits the rays to be incident through the side surfaces is minimized. In the semiconductor device shown in FIG. 3, the active regions of the pellet are located inside the electrode terminals, the inner portion of the cap 10 faced to the electrodes is protruded, the highly purified substrate 11 is stuck to the projection 12 in the same manner as in Example 1, and the device is sealed by a customary method. In this case, the aluminum wires 9 are located at positions other than the projection 13 of the cap 10 and are not crushed by the projection 13. The active regions of the thus sealed pellet are opposed to the highly purified substrate 11 maintaining a small clearance. Therefore, the angle which permits the alpha-particles to pass through the clearance is very reduced.

With the above-mentioned construction, the sources of alpha-particles which affect the pellet surface is reduced to about 1/5 to 1/20. Further, according to this Example, sufficient effects are obtained using a highly purified substrate 11 smaller than that of Example 1, and the device can be cheaply obtained.

EXAMPLE 4

Figure 4:
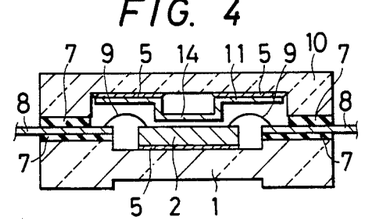

FIG. 4 shows a semiconductor device in which a projection 14 formed on the highly purified substrate 11 is located as close as possible to the active region of the pellet 2. If a silicon substrate is used as the highly purified substrate 11, it will become difficult to machine the projection. Therefore, a suitable highly purified substrate is obtained by drawing the highly purified aluminum thereby to form a projection, and a highly purified insulating material is coated on the surfaces of the substrate opposed to the pellet 2 in order to prevent the aluminum wires 9 from being short-circuited. The substrate may further be made of a highly purified insulating substrate. A quartz substrate or a high alumina ceramics substrate is used as an insulating substance.

According to the semiconductor device illustrated in FIG. 4, the portions other than the projection 14 are also made of a highly purified material, and make it possible to prevent the alpha-particles from entering through the side surfaces of the cap other than the projection 13 of a deep incident angle that was a problem extent in the case of the semiconductor device of FIG. 3.

Consequently, the sources of alpha-particles that affect the pellet surfaces is reduced to 1/5 to 1/50.

Moreover, the aluminum substrate 11 having a thickness of smaller than 0.1 mm, works to mitigate the stress owing to its plastic deformation even when it is brought into contact with the pellet 2. Hence, the gap between the aluminum substrate 11 and the pellet 2 can be selected to lie between 0 to 5 μm. In this case, therefore, it is expected that the alpha-particles can be reduced to 1/10 to 1/1000. The aluminum substrate 11 having a thickness of 40 μm is sufficient to shield the alpha-particles.

EXAMPLE 5

Figure 5:
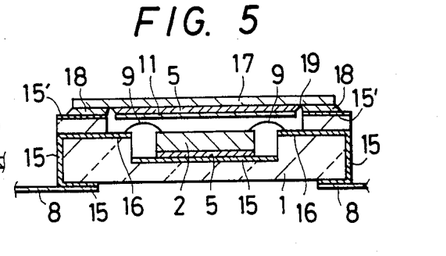

FIG. 5 shows a semiconductor device of a laminated ceramic package construction obtained by laminating a plurality of green ceramic (unsintered ceramic) sheets after they have been metallized with tungsten or molybdenum, and sintering them as a unitary structure.

In FIG. 5, the surface of the exposed metallized layer 15 has been plated with nickel and gold. The pellet 2 is fastened to the recessed bottom surface of the support substrate. The electrode terminals (not shown) of the pellet 2 are connected via aluminum wires 9 to a metallized layer 15 which is exposed on the projections 16 of the support substrate 1. The periphery of a cap 17 made of a Ni(29%)-Co(17%)-Fe(54%) alloy is fastened to an uppermost metallized layer 15' via a ring-like thin plate 18. Namely, the cap 17 is mounted on the support substrate 1, usually, by a ring welding method thereby to completely seal the pellet 2. The externally stretching leads 8 are adhered to the layer 15 which is metallized onto the bottom surface of the support substrate 1. Here, attention should be given to the fact that the silicon substrate 11 is adhered onto the inner surface of the cap 17 via the gold layer 5 based upon the same idea as that of Example 1. Namely, the alpha-particles radiated from the cap 17 are shielded by the silicon substrate 11 and are prevented from reaching the active regions of the pellet 2. Further, as is obvious from FIG. 5, the silicon substrate 11 protruding beyond a sealing surface 19 of the cap 17 serves to facilitate the positioning of the cap 17 with respect to the support substrate 1 during the step for mounting the cap 17.

EXAMPLE 6

Figure 6:
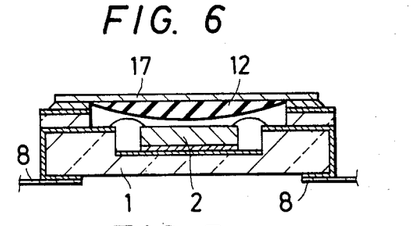

As illustrated in FIG. 6, a semiconductor device of a laminated ceramic package construction employs a highly purified material like that of Example 2, which is adhered onto the inner surface of the cap 17.

EXAMPLE 7

Figure 7:
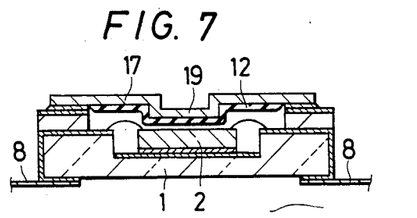

As illustrated in FIG. 7, a semiconductor device of a laminated ceramic package construction has a projection 19 formed on the cap 17 so as to approach the active region of the pellet 2, based on the same idea as that of Examples 3 and 4. Further, in this semiconductor device, the highly purified material 12 like that of Example 2 is adhered onto the inner surface of the cap 17.

EXAMPLE 8

Figure 8:
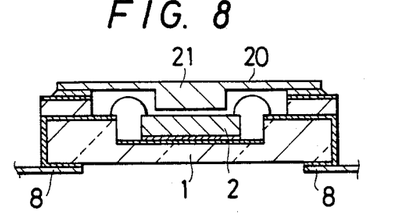

As shown in FIG. 8, a semiconductor device of a laminated ceramic package construction has a cap 20 made of a highly purified material consisting of silicon or aluminum, and a projection 21 formed in the cap 20 to prevent the effects of the alpha-particles radiated from the side surfaces of the support substrate 1.

EXAMPLE 9

Figure 9:
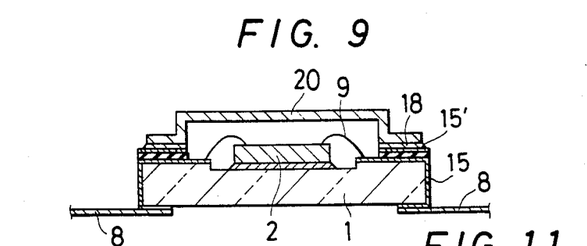

As shown in FIG. 9, a semiconductor device has an effective surface of the pellet 2 at a position nearly equal to, or sufficiently higher than, the surface of the uppermost metallized layer 15' of the support substrate 1. For this purpose, it is desired to employ a multi-layer printed ceramic package construction which is obtained by alternately printing a metallized paste and a ceramic paste on the green ceramic sheet (unsintered ceramic sheet) followed by sintering as a unitary structure, rather than to employ the aforementioned laminated ceramic package construction. A cap 20 made of a highly purified material which is outwardly protruded is used contrary to that of Example 7.

With this construction, it is possible to completely prevent the irradiation of alpha-particles from the side surfaces of the support substrate onto the effective surface of the pellet 2.

EXAMPLE 10

Figure 10:
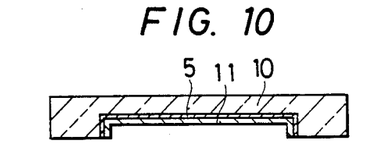
Figure 11:
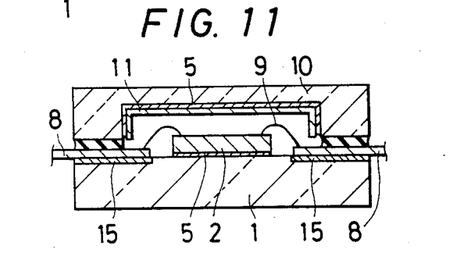

In Example 10, the alpha-particles which affect the effective surface of the pellet 2 can be reduced if a cap having recessed side surfaces covered with a highly purified material (refer to FIG. 10) is used or a cap which is wholly made of a highly purified material (not shown) is used. Further, greatly enhanced alpha-particle preventing effects can be obtained if the semiconductor device is constructed as shown in FIG. 11 using the above-mentioned cap 10 and the support substrate 1 of which the surface for adhering the pellet 2 is not recessed.

Namely, the upper surface of the pellet 2 is located at a position higher than the lower end of the cap made of a highly purified material 11 based on the same idea as that of Example 9. Therefore, the highly purified material covers the upper surface of the pellet over the whole alpha-particles incident solid angles, so that the amount of the alpha-particles is reduced to 1/1000 to $1/1\times 10^6$ through it varies depending upon the amount of alpha-particles radiated from the highly purified material.

In the semiconductor device of this Example, the construction has been so designed that the alpha-particles will not fall on the effective surface of the pellet even when the cap is deformed. However, the Example mentioned below adds improvement from a different point of view, i.e., the highly purified material is stuck onto the upper surface of the pellet to completely cope with the alpha-particles.

EXAMPLE 11

Figure 12:
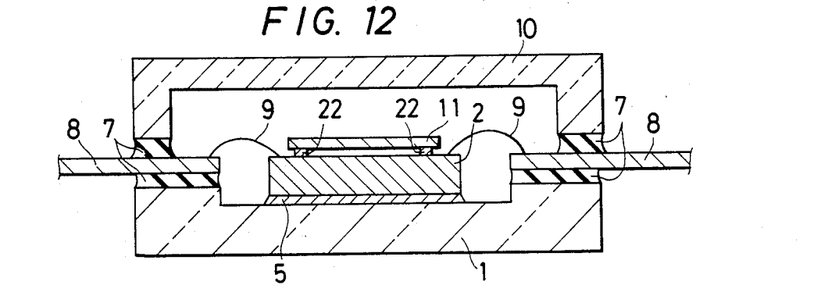

Silicon material is used as a base for the pellet. Hence, as in Example 1, a silicon substrate 11 is used as a highly purified substrate, and is stuck to the active region of the pellet 2 using an adhesive agent 22 such as boron glass, phosphorus silicate glass (PSG film) or polyimide resin, to construct a semiconductor device as shown in FIG. 12. Needless to say, the boron glass, the PSG film or the polyimide resin must be a highly purified material. Preferably, the surface of the silicon substrate 11 should be treated with $SiO_2$.

EXAMPLE 12

Figure 13:
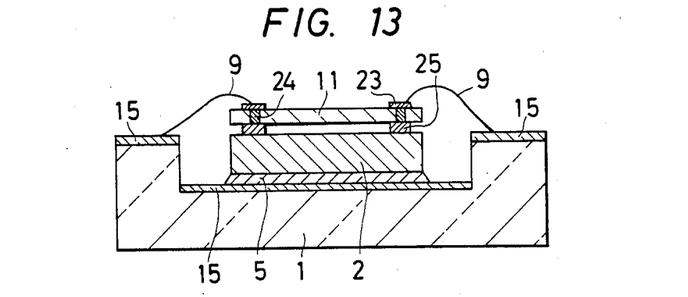

FIG. 13 illustrates a semiconductor device which is a modified embodiment of Example 11. In FIG. 13, the highly purified substrate 11 has bonding pads 23 to which the aluminum wires 9 will be bonded. The bonding pads 23 are connected to the terminals of the pellet via metallized layers 24 in the through holes of the highly purified substrate 11 and metal bumps 25. Aluminum wires 9 are bonded to the bonding pads 23 to make electrical connections with respect to the externally stretching leads 8. The above construction is effective when the active region is extending near to the terminals of the pellet.

The higher purified material used in this Example may, of course, be made of an insulating material.

EXAMPLE 13

Figure 14:
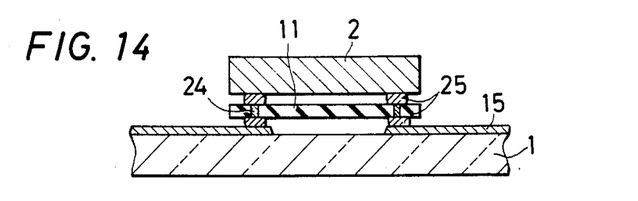

FIG. 14 shows a semiconductor device of a so-called face-down construction in which the active region of the pellet is faced to the surface of the support substrate without using aluminum wires, and the electric terminals are connected to the metallized layer of the support substrate via metal bumps. As diagramatized, the highly purified material 11 is provided between the active region of the pellet 2 and the support substrate 1. The electrical connection between the terminals of the pellet 2 and the metallized (wiring) layer 15 of the support substrate 1 is attained in the same manner as in Example 12. That is, the electrical connection is attained via a metallized layer 24 formed in the through holes of the highly purified substrate 11 and the metal bumps 25.

The Example mentioned below is to prevent the incident alpha-particles by utilizing the array of a plurality of pellets.

EXAMPLE 14

Figure 15:
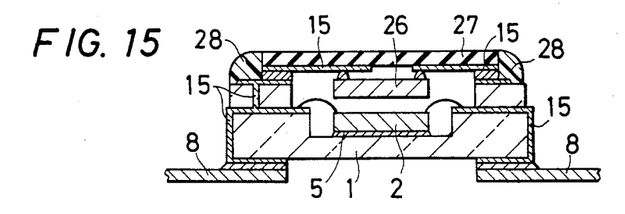

As illustrated in FIG. 15, a ceramic support substrate 27 having a face down-bonded pellet 26 is used as a cap. The pellet 26 is utilized to prevent the alpha-particles from falling on the active region of the pellet 2.

Here, the pellet 26 should have a plurality of transistors formed in an integrated manner such that their operation is not affected by the alpha-particles. For instance, a pellet incorporating a plurality of transistors forming a peripheral circuit of memory, should be positioned. To attain complete air-tightness, a resin 28 is coated between the cap or ceramic support substrate 27 and the support substrate 1.

EXAMPLE 15

Figure 16:
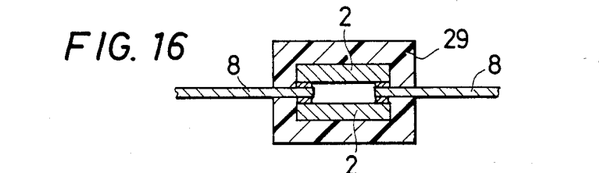

As illustrated in FIG. 16, the effect of alpha-particles radiated from the package 29 can be prevented if the pellet 2 are mounted in an opposing manner by facedown-bonding utilizing both surfaces of a lead frame 8, though the pellets may be affected to some extent by the alpha-particles emitted from each other. The package 29 is made of a thermosetting resin which is shaped by a transfer molding.

Here, the pellet on one side may simply be a silicon substrate with no transistor formed thereon but having an insulating film formed on the surface opposed to the other pellet.

According to the aforementioned variety of embodiments of the present invention, the erroneous operation of the pellet is prevented by providing a highly purified material, and modifying the shape of the package itself or specifying the position of the effective surface or active region of the pellet such that the effective surface of the pellet is less affected by the alpha-particles.

Further, according to the variety of embodiments of the present invention mentioned in the foregoing, the highly purified material is not directly adhered onto the effective surface of the pellet but a gap is provided between the highly purified material and the effective surface of the pellet. Consequently, the electrical characteristics of the semiconductor element are prevented from being affected even by the highly purified material.

Figure 17:
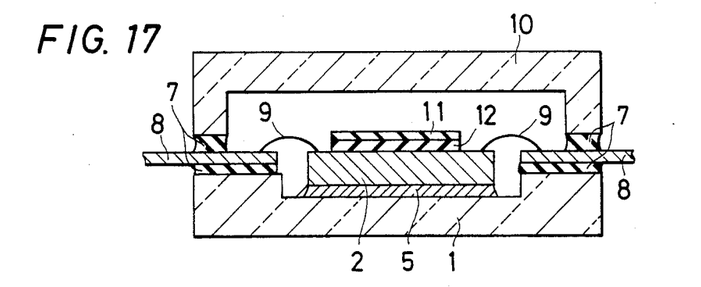

It is, however, allowable to directly adhere a combination of the highly purified substrate such as silicon substrate 11 and the highly purified polyimide resin 12 onto the effective surface of the pellet 2 as diagramatized in FIG. 17. In this case, the polyimide resin 12 is simply used for adhering the silicon substrate 11, and needs not be thickly coated. Therefore, the electrical characteristics of the semiconductor element are less affected by the polyimide resin 12. Here, the surface of the silicon substrate 11 should desirably be oxidized to prevent short-circuiting upon contact with aluminum wires 9. However, when a highly purified insulating substance is used as the substrate material, the oxidation treatment is not necessary.

Here, the incident solid angle mentioned in the above-mentioned Examples refers to an angle $\theta$ as illustrated in FIG. 8. A shallow incident solid angle means that the angle $\theta$ is small, and a deep incident solid angle means that the angle $\theta$ is great.

Figure 18:
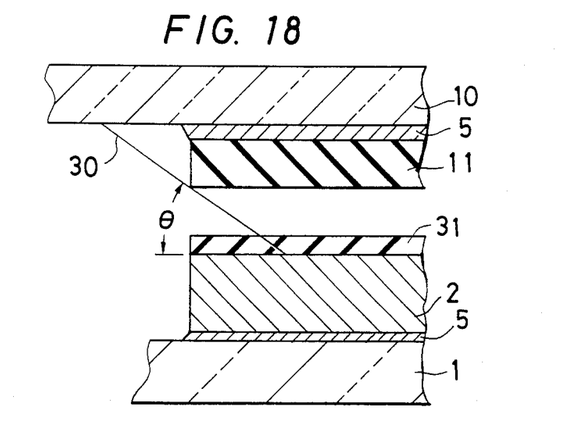
FIG. 18 is a diagram to illustrate the present invention.

In FIG. 18, reference numeral 30 denotes an incident locus of the alpha-particles, and 31 denotes a protection coating formed on the surface of the pellet 2, consisting, for example, of an SiO film. As is obvious from FIG. 18, the incident alpha-particles which affect the effective surface of the pellet can be reduced by adjusting the thickness of the protection coating 31 of the pellet 2, or by controlling the thickness or area of the highly purified material 11 which works to shield the alpha-particles.

According to the semiconductor devices illustrated in the aforementioned variety of Examples, pieces of a highly purified substance are effectively arrayed to prevent the alpha-particles from being incident upon the semiconductor element. The invention can be easily applied to multichip packages other than those of Examples 14 and 15.

The present invention can be effectively applied to pellets which form a dynamic RAM (random access memory) or a static RAM consisting of a plurality of insulated gate field effect transistors which deal with signals of such small electric quantities that may be disturbed by the alphs-particles.

Figure 19:
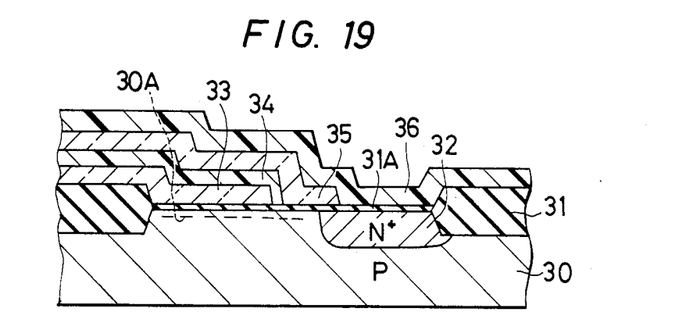
FIG. 19 is a cross-sectional view of a memory cell.
Figure 20:
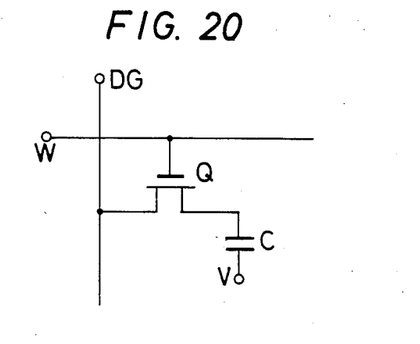
FIG. 20 is a diagram of an equivalent circuit of the memory cell illustrated in FIG. 19.

FIG. 19 illustrates a memory cell construction in a pellet forming the above-mentioned dynamic RAM, and FIG. 20 shows an equivalent circuit of the memory cell.

In FIG. 19, reference numeral 30 denotes a p-type silicon substrate having a thick field $SiO_2$ coating 31. In the opening of the $SiO_2$ film 31 is formed a thin $SiO_2$ film 31A. Reference numeral 32 denotes an $N^+$-type diffusion region, 33 a first low-resistance polycrystallinesilicon layer, 34 an insulating coating made of a phosphorus silicate glass formed between the layers, 35 a second low-resistance polycrystallinesilicon layer, and reference numeral 36 denotes a passivation coating composed of a phosphorus silicate glass.

The second polycrystallinesilicon layer 35 formed on the $SiO_2$ coating 31A serves as a word line W shown in FIG. 20 and as a gate electrode of an N-channel MOS (metal-oxide-semiconductor) type transistor Q. The $N^+$-type diffusion region 32 serves as a digit wire DG shown in FIG. 20. A surface 30A of the substrate corresponding to the drain region of the transistor Q forms a capacitor C for storing information shown in FIG. 20, together with a portion of the first polycrystallinesilicon layer 33 which is formed on the surface 30A via the $SiO_2$ coating 31A. The polycrystallinesilicon layer 33 is further connected to a potential supply V shown in FIG. 20. The writing of information charge into the capacitor C or the reading of information charge from the capacitor C is controlled by the switching function of the transistor Q.

The thus constructed memory cells are formed in a plurality of numbers in the semiconductor chips to form a RAM. The density of integration increases with the increase in the memory capacity of the RAM, whereby the cell size decreases. Therefore, with the MOS-type dynamic RAM having a memory capacity of greater than 16K bits, the capacitance of the capacitor C is very small, and the stored information is easily reversed by the electron-hole pairs formed by the alpha-particles incident upon the surface 30A of the substrate, giving rise to the occurrence of a so-called soft error.

The above-mentioned soft error can be prevented if the present invention is applied to the dynamic RAM.

Figure 21:
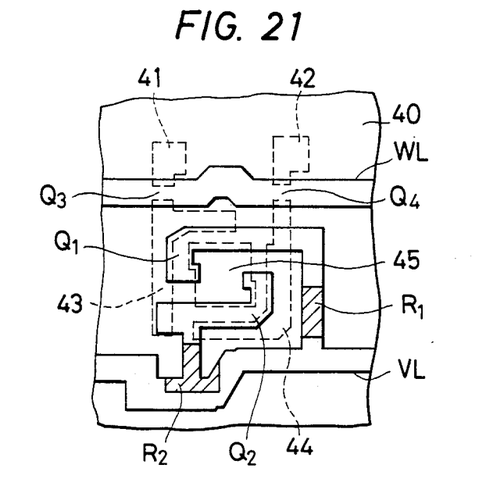
FIG. 21 is a plan view showing another memory cell.
Figure 22:
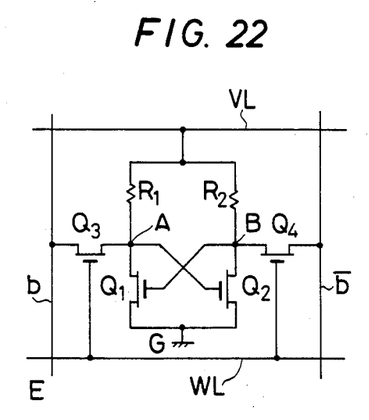
FIG. 22 is a diagram of an equivalent circuit of the memory cell illustrated in FIG. 21.

FIG. 21 is a plan view illustrating the memory cell in the pellet which forms the above-mentioned static RAM, and FIG. 22 illustrates an equivalent circuit of the memory cell.

In FIG. 21, regions 41, 42, 43, 44 and 45 surrounded by dotted lines are diffusion regions formed in the semiconductor substrate 40. A power-supply line VL and a word line WL composed of a polycrystallinesilicon layer are formed on the insulation layer which is formed on the surface of the semi-conductor substrate 40. Here, symbols $Q_1$, $Q_2$, $Q_3$ and $Q_4$ denote N-channel MOS transistors, and $R_1$ and $R_2$ denote load resistors formed by increasing the resistance of portions of the power-supply line VL. Bit lines b, $\bar{b}$ and a ground line G of FIG. 22 are composed of an aluminum layer, and are formed on the insulation layer on the surface of the semiconductor substrate 40 so as to cross the power-supply line VL and word line WL.

Even in the case of the static RAM, the irradiation of alpha-particles on the point A or point B of FIG. 22 causes the operation state (ON or OFF) of the transistors $Q_1$ and $Q_2$ to be reversed. However, such a soft error can also be effectively prevented by the application of the present invention.

Figure 23:
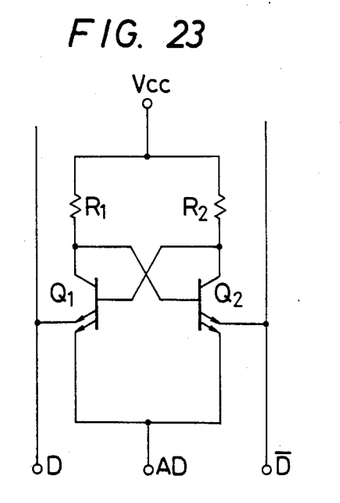
FIG. 23 is a diagram of a memory cell circuit of a bipolar RAM (Random Access Memory).

FIG. 23 illustrates a memory cell circuit of a bipolar RAM of the ECL (emitter coupled logic) type to which is applied the present invention. The memory cell diagramatized in FIG. 23 constitutes a flip-flop relying upon multi-emitter transistors $Q_1$, $Q_2$ and resistors $R_1$, $R_2$. Symbol $V_{CC}$ denotes a potential supply, AD an address line, and D and $\overline{D}$ denote data lines, respectively. Even in the bipolar RAM relying upon the above memory cell construction and having large capacity and high degree of integration, the electron-hole pairs formed by the irradiation of alpha-particles easily cause the state of flip-flop to be reversed, resulting in the occurrence of soft error.

Such a soft error can also be effectively prevented by the application of the present invention.

What is claimed is:

1. A semiconductor device comprising:
   a support substrate having lower and upper surfaces;
   a semiconductor element fixed on a portion of said upper surface of the support substrate;
   a cap having lower and upper surfaces and connected at a portion of its lower surface to the peripheral portion of said upper surface of the support substrate so as to seal said semiconductor element; and
   a shielding member for shielding the semiconductor element from alpha-particles radiated from said cap, said shielding member being disposed on another portion of said lower surface of the cap so as to be provided opposite to said semiconductor element,
   wherein said another portion of said lower surface of the cap protrudes toward said semiconductor element.

2. A semiconductor device according to claim 1, wherein said support substrate and cap are comprised of ceramic material respectively.

3. A semiconductor device comprising:
   a support substrate having lower and upper surfaces;
   a semiconductor element fixed on a portion of said upper surface of the support substrate; and
   a cap of a shielding material for shielding the semiconductor element from alpha-particles, said cap being connected to the peripheral portion of said upper surface of the support substrate so as to seal said semiconductor element,
   wherein said cap has a projection portion projecting toward said semiconductor element.

4. A semiconductor device comprising:
   a support substrate having lower and upper surfaces;
   a semiconductor element fixed on a portion of said upper surface of the support substrate;
   a cap having lower and upper surfaces and connected at a portion of its lower surface to the peripheral surface of said upper surface of the support substrate so as to seal said semiconductor element; and
   a shielding member for shielding the semiconductor element from alpha-particles radiated from said cap, said shielding member being disposed on another portion of said lower surface of the cap so as to be provided opposite to said semiconductor element, wherein the portion of said shielding member located opposite to said semiconductor element protrudes from other portions of said shielding member toward said semiconductor.

5. A semiconductor device comprising:
   a support substrate having lower and upper surfaces;
   a semiconductor element fixed on a portion of said upper surface of the support substrate;
   a cap having lower and upper surfaces and connected at a portion of its lower surface to the peripheral portion of said upper surface of the support substrate so as to seal said semiconductor element; and
   a shielding member for shielding the semiconductor element from alpha-particles radiated from said cap, said shielding member being disposed on another portion of said lower surface of the cap so as to be provided opposite to said semiconductor element, wherein a surface portion of said shielding member protrudes from other surface portions of said shielding member so as to lie near a surface of said semiconductor element in which an active element is formed.

6. A semiconductor device according to claim 5, wherein said shielding member gradually protrudes toward said semiconductor element such that the height of said shielding member above the surface of said semiconductor element where the active element is formed is greatest at an outer peripheral portion of said shielding member and smallest at an inner portion of said shielding member directly opposite where said active element is formed with the height changing gradually from said greatest to said smallest heights.

7. A semiconductor device according to claim 5, wherein said shielding member is a highly purified material which gelatinizes or solidifies from a liquid state to form the sealing member.

8. A semiconductor device according to claim 7, wherein said highly purified material includes at least one selected from the group consisting of silicon rubber, polyimide resin and polyimide isoindolequinazolinedione resin.

9. A semiconductor device according to claim 5, wherein said shielding member comprises a plate of highly purified aluminum.

10. A semiconductor device according to claim 9, wherein said aluminum has a purity of at least 99.999%.

11. A semiconductor device according to claim 5, wherein transistors for constituting a memory circuit are formed in said semiconductor element.

12. A semiconductor device according to claim 6, wherein transistors for constituting a memory circuit are formed in said semiconductor element.

13. A semiconductor device according to claim 7, wherein transistors for constituting a memory circuit are formed in said semiconductor element.

14. A semiconductor device according to claim 8, wherein transistors for constituting a memory circuit are formed in said semiconductor element.

15. A semiconductor device according to claim 9, wherein transistors for constituting a memory circuit are formed in said semiconductor element.

16. A semiconductor device according to claim 10, wherein transistors for constituting a memory circuit are formed in said semiconductor element.

17. A semiconductor device according to claim 5, wherein said shielding member abruptly protrudes toward said semiconductor element such that the height of said shielding member above the surface of said semiconductor element where the active element is formed is greatest at an outer peripheral portion of said shielding member and smallest at an inner portion of said shielding member directly opposite where said active element is formed with the height changing abruptly from said greatest to said smallest heights.

18. A semiconductor device according to claim 17, wherein said shielding member has a first surface facing toward said semiconductor element and a second surface facing toward said cap, and further wherein said second surface is attached to said cap at said outer peripheral portion of said shielding member and spaced apart from said cap at said inner portion.

19. A semiconductor device according to claim 17, wherein said shielding member has a first surface facing toward said semiconductor element and a second surface facing toward said cap, and further wherein said cap also protrudes abruptly toward said semiconductor element so that said second surface is in contact with said cap at said outer peripheral portion of said shielding member and at said inner portion.

20. A semiconductor device comprising:
a semiconductor element having lower and upper main surfaces, said upper main surface having an active element formed therein;
a sealing body for sealing said semiconductor element being formed of a sealing substrate and a sealing cap arranged opposite to each other, said semiconductor element being connected to a portion of an inner surface of said sealing substrate at its lower main surface; and a shielding member for shielding said upper main surface of the semiconductor element from alpha-particles radiated from said sealing cap, said shielding member being disposed on an inner surface of said sealing cap and having a thickness thicker at a portion located opposite to said upper main surface of the semiconductor element than at other portions of said shielding member.

21. A semiconductor device according to claim 18, wherein said shielding member is a highly purified material which gelatinizes or solidifies from a liquid state to form the sealing member.

22. A semiconductor device according to claim 18, wherein said highly purified material includes at least one selected from the group consisting of silicon rubber, polyimide resin or polyimide isoindolequinazolinedione resin.

23. A semiconductor device according to claim 18, wherein the thickness of said shielding member gradually increases such that the height of said shielding member above the surface of said semiconductor element where the active element is formed is greatest at an outer peripheral portion of said shielding member and smallest at an inner portion of said shielding member directly opposite where said active element is formed with the shielding member thickness increasing gradully from the portion of greatest height to the portion of smallest height.

24. An alpha particle resistant semiconductor arrangement comprising:
a first and a second semiconductor element, each semiconductor element having a circuit adjacent one surface thereof,
said first and second semiconductor elements being mounted in a package with said surface adjacent said circuit of said first semiconductor element being in face to face relationship with said surface adjacent said circuit of said second semiconductor element,
such that each semiconductor element shields the circuit of the other from direct impact of alpha particles from said package.

* * * * *